United States Patent
Sun et al.

(10) Patent No.: US 9,601,587 B2
(45) Date of Patent: Mar. 21, 2017

(54) SEMICONDUCTOR DEVICE HAVING ELEVATED STRUCTURE

(71) Applicant: TAIWAN SEMICONDUCTOR MANUFACTURING COMPANY, LTD., Hsinchu (TW)

(72) Inventors: Sey-Ping Sun, Hsinchu (TW); Tsung-Lin Lee, Hsinchu (TW); Chin-Hsiang Lin, Hsinchu (TW); Chih-Hao Chang, Chu-Bei (TW); Chen-Nan Yeh, Sinfong Township (TW); Chao-An Jong, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/603,861

(22) Filed: Jan. 23, 2015

(65) Prior Publication Data

US 2015/0129990 A1    May 14, 2015

Related U.S. Application Data

(63) Continuation of application No. 12/702,683, filed on Feb. 9, 2010, now Pat. No. 8,946,828.

(51) Int. Cl.
| | |
|---|---|
| *H01L 29/423* | (2006.01) |
| *H01L 21/768* | (2006.01) |
| *H01L 29/49* | (2006.01) |
| *H01L 29/78* | (2006.01) |
| *H01L 29/66* | (2006.01) |

(52) U.S. Cl.
CPC .... *H01L 29/4232* (2013.01); *H01L 21/76834* (2013.01); *H01L 21/76849* (2013.01); *H01L 21/76897* (2013.01); *H01L 29/495* (2013.01); *H01L 29/4966* (2013.01); *H01L 29/78* (2013.01); *H01L 29/66545* (2013.01)

(58) Field of Classification Search
CPC ............. H01L 29/4232; H01L 29/4966; H01L 29/495; H01L 29/78; H01L 21/76897
See application file for complete search history.

(56) References Cited

U.S. PATENT DOCUMENTS

| | | | | |
|---|---|---|---|---|
| 5,695,810 | A | * 12/1997 | Dubin | ................ C23C 18/1603 257/E21.584 |
| 5,885,890 | A | * 3/1999 | Dennison | .............. H01L 23/485 257/E21.654 |

(Continued)

OTHER PUBLICATIONS

Office Action dated Apr. 17, 2012 from corresponding application No. CN 201010221419.1; 4 pages.

*Primary Examiner* — John P Dulka
(74) *Attorney, Agent, or Firm* — Hauptman Ham, LLP

(57) ABSTRACT

A semiconductor device includes a gate stack overlying a substrate. The semiconductor device further includes a spacer on sidewalls of the gate stack, where a top surface of the spacer is above a top surface of the gate stack. Additionally, the semiconductor device includes a protection layer overlying the gate stack and filling at least a portion of a space surrounded by the spacer above the top surface of the gate stack. Furthermore, the semiconductor device includes a contact hole over the spacer, where the contact hole extends over the gate stack, and where a sidewall of the contact hole has a step-wise shape.

20 Claims, 9 Drawing Sheets

(56) References Cited

U.S. PATENT DOCUMENTS

| | | | |
|---|---|---|---|
| 5,950,090 A | 9/1999 | Chen et al. | |
| 5,953,614 A * | 9/1999 | Liu | H01L 21/76897 257/E21.199 |
| 6,015,741 A * | 1/2000 | Lin | H01L 21/76897 257/E21.438 |
| 6,069,022 A | 5/2000 | Leas et al. | |
| 6,072,221 A * | 6/2000 | Hieda | 257/382 |
| 6,080,648 A * | 6/2000 | Nagashima | H01L 21/28518 257/E21.165 |
| 6,445,050 B1 | 9/2002 | Chediak et al. | |
| 6,485,654 B1 * | 11/2002 | Liu | H01L 21/76897 216/13 |
| 6,562,716 B2 * | 5/2003 | Hashimoto | H01L 21/28052 257/E21.006 |
| 6,576,519 B1 * | 6/2003 | Houston | H01L 21/32139 257/E21.314 |
| 6,806,178 B2 * | 10/2004 | Segawa | H01L 21/28052 257/E21.199 |
| 6,861,751 B2 * | 3/2005 | Tao | H01L 21/76829 257/750 |
| 6,946,376 B2 * | 9/2005 | Chediak | H01L 21/76838 257/E21.507 |
| 7,309,899 B2 * | 12/2007 | Yoshida | H01L 29/4983 257/395 |
| 8,035,165 B2 | 10/2011 | Yeh et al. | |
| 8,436,404 B2 | 5/2013 | Bohr et al. | |
| 8,946,828 B2 * | 2/2015 | Sun et al. | 257/382 |
| 2002/0117722 A1 * | 8/2002 | Osada | G11C 11/412 257/379 |
| 2003/0203613 A1 | 10/2003 | Houston | |
| 2004/0166631 A1 | 8/2004 | Hurley | |
| 2006/0046449 A1 | 3/2006 | Liaw | |
| 2006/0264047 A1 | 11/2006 | Kim et al. | |
| 2007/0051632 A1 * | 3/2007 | Sato et al. | 205/84 |
| 2007/0155165 A1 | 7/2007 | Park et al. | |
| 2008/0224317 A1 | 9/2008 | Machkaoutsan et al. | |
| 2008/0290380 A1 * | 11/2008 | Sheu | H01L 29/66545 257/288 |
| 2009/0057730 A1 * | 3/2009 | Furukawa et al. | 257/288 |
| 2009/0146215 A1 * | 6/2009 | Ogawa | H01L 21/82385 257/369 |
| 2009/0159978 A1 * | 6/2009 | Matsubara | H01L 21/76897 257/368 |
| 2009/0206425 A1 * | 8/2009 | Tsujiuchi | H01L 27/228 257/421 |
| 2009/0236664 A1 | 9/2009 | Brown et al. | |
| 2009/0325356 A1 * | 12/2009 | Shin et al. | 438/303 |

\* cited by examiner

SEMICONDUCTOR DEVICE HAVING ELEVATED STRUCTURE

PRIORITY CLAIM

The present application is a continuation of U.S. application Ser. No. 12/702,683, filed Feb. 9, 2010, which is incorporated herein by reference in its entirety.

TECHNICAL FIELD

The present disclosure relates to a semiconductor device having an elevated structure.

BACKGROUND

As the degree of integration in semiconductor devices increases, dimensions and wire widths in the integrated circuits continue to shrink. Accordingly, fabrication of semiconductor devices is becoming more complex and demanding. For instance, when a photolithography process is performed to pattern circuitry on a wafer, the possibility of misalignment increases due to down-scaling, and thus unwanted patterns may be formed.

FIG. 1 is a view of a semiconductor device 100. The semiconductor device 100 includes a substrate 110, a polysilicon gate 120, a spacer 125, a silicide layer 121, and a dielectric layer 150. When the height of the spacer 125 is equal to or lower than that of the gate 120, the silicide layer 121 often has a mushroom shape and may extrude beyond the boundary of the gate 120, as depicted in FIG. 1. Therefore, a contact metal 160 (e.g., tungsten or copper) on a source/drain region 115 might form a short circuit at 129 with the gate 120 via silicide layer 121, as a result of misalignment during the photolithography process for forming the contact opening on the source/drain region 115. Such short-circuiting between the gate 120 and the source/drain contact, i.e., contact metal 160, increases the population of defective cells. Further, such short-circuits increase the overall manufacturing cost because of rework processes to fix such defective cells, and consumption of additional materials such as photoresist and chemical solvents. The short-circuiting problems are further worsened as the silicide layer 121, which is provided to increase the conductivity of the gate 120, tends to extrude outwardly to the top of the spacer 125 and form an undesirable short-circuit with contact metal 160 when photolithographic misalignment occurs. The gate 120 can also be a metal gate in which case no silicide formation is formed on the metal gate 120. However, if photolithographic misalignment occurs, short circuits are also likely to occur.

SUMMARY

In one or more embodiments, a semiconductor device comprises a semiconductor substrate; a gate stack overlying the substrate, the gate stack including a gate dielectric and a gate electrode; a spacer formed on sidewalls of the gate stack, wherein a top surface of the spacer is higher than a top surface of the gate stack; and a protection layer overlying the gate stack and filling at least a portion of a space surrounded by the spacer on the top surface of the gate stack.

In one or more embodiments, a method of manufacturing a semiconductor device comprises: forming a gate stack over an active area in a top surface of a semiconductor substrate; forming a spacer on sidewalls of the gate stack; removing a top portion of the gate stack such that a top surface of the spacer is higher than a top surface of a resulting gate stack; and forming a protection layer on the resulting gate stack to fill at least a portion of a space surrounded by the spacer on the top surface of the resulting gate stack.

In one or more embodiments, a semiconductor device comprises: a semiconductor substrate having at least an active area on a top surface thereof; a gate stack formed over the active area, said active area further comprising source and drain regions adjacent the gate stack; a spacer formed on sidewalls of the gate stack; an elevated contact structure extending upwardly from the source or drain region to have a top surface higher than a top surface of the gate stack; and a protection layer overlying the gate stack and the spacer and filling at least a portion of a space formed between the top surface of the elevated contact structure and the top surface of the gate stack.

In one or more embodiments, a method of forming a semiconductor device from a gate replacement structure comprising a gate stack overlying an active area on a top surface of a semiconductor substrate, a spacer on sidewalls of the gate stack, and a dielectric layer overlying the substrate around the gate stack and the spacer, said active area further comprising source and drain regions adjacent the gate stack, comprises: forming a contact opening in the dielectric layer over the source or drain region on the top surface of the substrate; filling a conductive material in the contact opening; forming a conductive elevated structure on the conductive material filled in the contact opening such that a top surface of the elevated structure is higher than a top surface of the gate stack; and forming a protection layer on the gate stack and the spacer to fill at least a portion of a space formed between the top surface of the elevated structure and the top surface of the gate stack.

BRIEF DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Throughout the description presented below, it will be understood that when a layer is referred to as being 'on' or 'over' another layer or substrate, it can be in direct contact with the other layer or substrate, or intervening layers may also be present therebetween.

Figure 5:
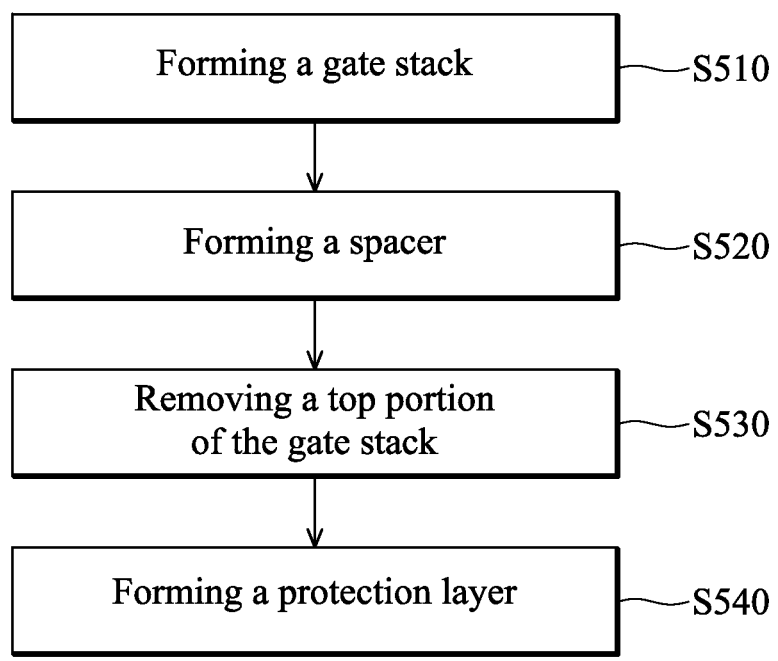
FIG. 5 is a flow chart of the steps performed in the fabrication process shown in FIG. 2A-2E.

FIGS. 2A-2E are schematic cross-sectional views of a semiconductor device 200 being manufactured in a fabrication process according to one or more embodiments. FIG. 5 is a flow chart of the steps performed in the fabrication process shown in FIG. 2A-2E. The fabrication process is described with reference to FIGS. 2A-2E and FIG. 5.

At step S510 (FIG. 5), a gate stack 220 is formed on a substrate 210. The substrate 210 is, for instance, a silicon substrate. The substrate 210 may alternatively comprise silicon germanium (SiGe), Gallium arsenic, or other suitable semiconductor materials. Further, shallow trench isolation (STI) regions (not shown) may be formed in the substrate 210 for isolating active areas in the substrate 210. The isolation structure, i.e., STI regions, may be formed of silicon oxide, silicon nitride, silicon oxynitride, fluoride-doped silicate, and/or any other low k dielectric materials. The substrate 210 may further include other features, such as various doped regions, a buried layer, and/or an epitaxy (epi) layer. In addition, the substrate 210 may be a semiconductor on insulator, such as silicon on insulator (SOI). In other examples, the substrate 210 may include a doped epi layer, a gradient semiconductor layer, and/or may further include a semiconductor layer overlying another semiconductor layer of a different type such as a silicon layer on a silicon germanium layer.

The gate stack 220 formed over the substrate 210 includes a gate dielectric 223, which may comprise a high-k dielectric layer, an interfacial layer, and/or combinations thereof. In one or more embodiments, the high-k dielectric layer is included in the gate dielectric 223, and is formed of, for instance, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. The thickness of the high-k dielectric layer is in the range of, for instance, about 5-about 40 Å.

In some embodiments, the gate dielectric 223 may also comprise an interfacial layer (not shown) to reduce damages between the gate dielectric 223 and the substrate 210. Examples of the interfacial layer include silicon oxide having a thickness ranging from about 5 to about 10 Å formed on the substrate 210. The gate dielectric 223 may be formed on the interfacial layer by atomic layer deposition (ALD) or other suitable techniques.

The gate stack 220 further includes a gate electrode 225 formed over the gate dielectric 223. The thickness of the gate electrode 225 ranges, for instance, from about 10 to about 200 Å. The gate electrode 225 may be formed of poly-silicon or metal. In one or more embodiments, the gate electrode 225 may comprise Al, AlTi, Ti, TiN, TaN, Ta, TaC, TaSiN, W, WN, MoN, and/or other suitable conductive materials. The gate electrode 225 may be formed by chemical vapor deposition (CVD), physical vapor deposition (PVD or sputtering), plating, atomic layer deposition (ALD), and/or other suitable processes.

Figure 2A:
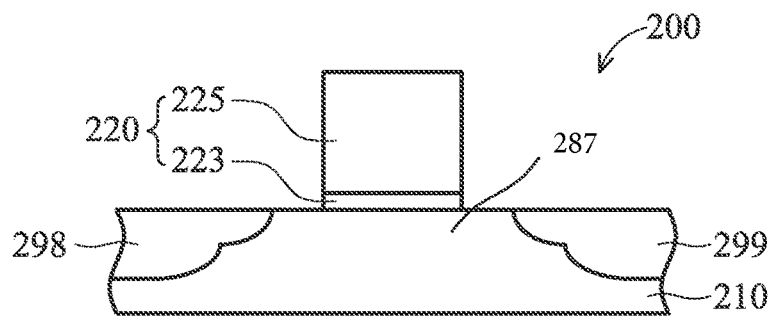
FIGS. 2A-2E are schematic cross-sectional views of a semiconductor device manufactured in a fabrication process according to an embodiment.

The gate stack 220 can be patterned as shown in FIG. 2A, for instance, by a photolithography process. Specifically, a photo-resist layer (not shown) is deposited on layers for the gate stack 220 overlying the substrate 210, for example, by spin coating, and is used to form an intended pattern of the gate stack 220 by way of irradiating, developing, drying, etching, and other suitable processes. In one or more embodiments, an etch process is performed to remove layers other than the intended pattern of the gate stack 220 shown in FIG. 2A. If necessary, such an etch process may be performed multiple times. However, gate patterning is not limited to a photolithography process using photo-resists, and may be performed by an immersion lithography, electron beam lithography, or other suitable processes. As a result, the pattern of the gate stack as shown in FIG. 2A is obtained.

In one or more embodiments, a hard mask (not shown) may further be formed over the gate stack 220. The hard mask may include silicon nitride, silicon oxynitride, silicon carbide or other suitable materials. The hard mask may be formed by a deposition process or any suitable methods, and used as a mask to pattern the gate stack 220.

Figure 2B:
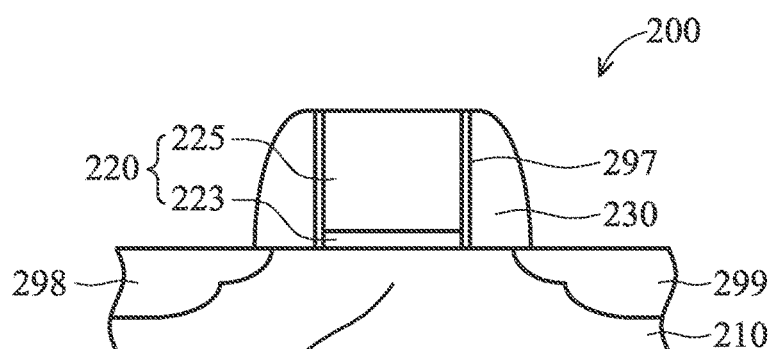

Referring to FIGS. 2B and 5, a spacer 230 is formed on sidewalls of the gate stack 220 (S520). The spacer 230 is, for instance, a dielectric layer with no or a predetermined amount of impurity therein. In one or more embodiments, the spacer 230 may be formed of silicon nitride. Another example of the spacer 230 includes oxynitride. In another example, the spacer 230 is silicon carbide. Also, the spacer 230 may contain impurity, such as boron, carbon, fluorine, or combinations thereof.

The spacer 230 may be formed by using suitable methods. First, a layer for the spacer 230 is deposited over the gate stack 220 and the substrate 210, for example, by plasma enhanced chemical vapor deposition (PECVD), low-pressure chemical vapor deposition (LPCVD), sub-atmospheric chemical vapor deposition (SACVD), atomic layer deposition (ALD), and the like. The layer for spacer 230 may be formed to have any suitable thickness, e.g., in the range of about 50 Å to about 400 Å.

Further, the deposited layer for the spacer 230 is patterned to form the spacer 230 in contact or adjacent to the sidewalls of the gate stack 220. The patterning may be performed by suitable techniques, such as a wet etch process, a dry etch process, or combinations thereof. In one or more embodiments, the patterning to form the spacer 230 is conducted by an anisotropic dry etching process. The remaining portions of the deposited layer for the spacer 230 after the etch process thus form the spacer 230, as shown in FIG. 2B.

Although FIG. 2B shows only one layer of spacer formed on the sidewalls of the gate stack 220, if necessary, multiple layers of spacers/liners may be formed by suitable techniques. For instance, a second spacer (not shown) may be formed next to the spacer 230 to protect the spacer 230 from subsequent wet etching and/or cleaning processes or to rebuild the spacer structure, which may be damaged in subsequent processes. The additional spacers (not shown) as mentioned may be formed of silicon nitride, oxynitride, silicon carbide, or the combinations thereof. The additional spacers may be formed by using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), and the like.

Also, a liner layer 297 (only shown in FIG. 2B and omitted in other figures for the sake of simplicity) may be formed prior to the formation of the spacer 230 between the gate stack 220 and the spacer 230 to prevent exposure of the gate stack 220 and protect the gate stack 220 from damage or loss during subsequent processes. Such a liner layer may be formed of, for instance, silicon oxide, oxynitride, silicon nitride, silicon boron nitride, or boron nitride. The thickness of the liner layer ranges, for instance, from about 15 Å to about 100 Å.

The above description where the gate electrode 225 is formed before a spacer 230, in the order illustrated in FIGS. 2A-2B, is known as a gate-first process. In an alternative, gate-last process, the same or similar steps of the gate-first process is performed to form a dummy gate, e.g., dummy poly-silicon, and a spacer 230, in the order illustrated in FIGS. 2A-2B. The dummy gate is replaced afterwards with a suitable metal or conductive material to obtain the gate electrode 225.

Further, source and drain regions 298, 299 may be formed in an active area 287 of the substrate 210 by using the gate stack 220 and the spacer 230 as a mask. Thus, the active area 287 includes the gate stack 220 and the source and drain regions 298, 299 adjacent the gate stack 220. For example, the formation of the source/drain regions 298, 299 may be performed by an ion implantation or a diffusion process. Depending on the type of the semiconductor device, the source/drain regions may be doped with p-type dopants, such as boron or $BF_2$, n-type dopants, such as phosphorus or arsenic, and/or combinations thereof. In addition, although omitted herein for brevity, lightly doped source/drain (LDD) regions (not shown) may be formed in the substrate 210 prior to the formation of the spacer 230. The LDD regions may be formed in the substrate 210 by one or more implantation processes, such as an ion implantation process.

FIG. 2B shows source/drain regions 298, 299 formed as a result of a first step of ion implantation using a thinner spacer (not shown) as a mask, and a second step of removing and rebuilding the thinner spacer to become a thicker spacer as denoted at 230. The thicker spacer 230 covers partially the previously formed source/drain regions 298, 299. Other arrangements as discussed herein are, however, not excluded.

Figure 2C:
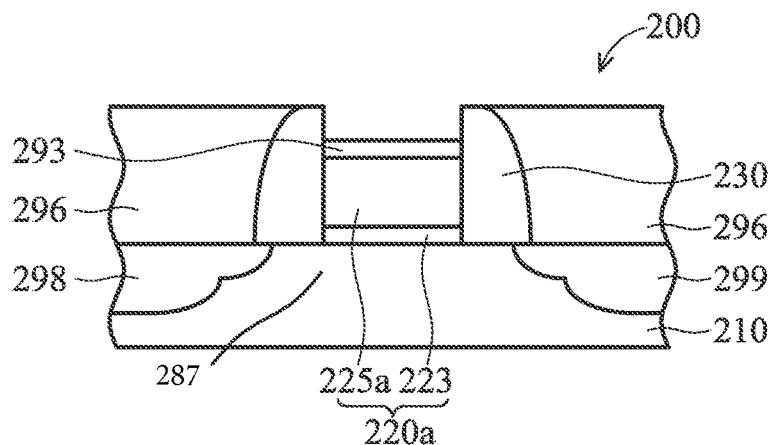

Referring to FIGS. 2C and 5, removal of a top portion of the gate stack 220 is performed (S530). This removal process can selectively recess the top portion of the gate electrode 225 such that the top surface of the resulting gate electrode 225a is lower than the top surface of the spacer 230 by a predetermined distance. The distance between the top surface of the gate electrode 225a and that of the spacer 230 may be determined appropriately to prevent a short circuit between the gate electrode 225a and a source/drain contact to be formed. In one or more embodiments, the distance may be, for instance, in the range of about 20 nm or more.

The removal step S530 may be performed, for example, by a dry etch process. In one or more embodiments, prior to the etch process to recess the gate stack 220, a dummy layer 296 may be formed on source/drain regions 298, 299 to protect them from the etch process. Such a dummy layer 296 in one or more embodiments is a dielectric layer, also referred to herein as "dummy ILD" (interlayer dielectric), and includes, but is not limited to, silicon oxide, silicon nitride, silicon oxynitride, spin-on glass (SOG), fluorinated silica glass (FSG), carbon doped silicon oxide, polyimide, other suitable dielectric materials, and/or combinations thereof. In some embodiments, the dummy layer 296 is a photo-resistant layer. The dummy layer 296 may have any suitable thickness, for instance, 4000 Å. Subsequently, the dummy layer 296 may be planarized by a chemical-mechanical-polishing (CMP) process until the top surface of the gate stack 220 is exposed. The resulting structure is referred to in one or more embodiments as a replacement gate structure. After the gate stack 220 is recessed to form the gate stack 220a, the dummy layer 296 is removed by any suitable method, for instance, by a dry etch process.

Figure 1:
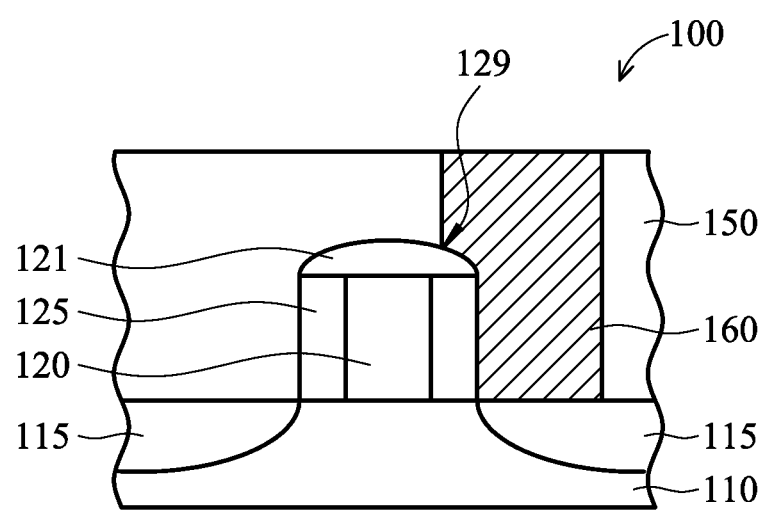
FIG. 1 is a schematic cross-section view of a semiconductor device.

Afterwards, according to one or more embodiments, a silicidation (e.g., self-aligned silicidation) process or any suitable method may be performed to provide the top surfaces of the gate electrode 225a and/or source/drain regions 298, 299 with silicided regions as contact features. For example, a metal layer (not shown) is blanket-deposited over the exposed gate electrode 225a and/or source/drain regions 298, 299, and then an annealing step is performed to form metal silicide layers on the gate electrode 225a and/or source/drain regions 298, 299 (only silicided region 293 on gate electrode 225a is illustrated in FIG. 2C). Any un-reacted metal is subsequently removed, e.g., by a wet chemical etch. Since the gate electrode 225a is confined within the boundary defined by spacer 230, silicided region 293 is likewise confined within such boundary, and is prevented from extruding to the top of spacer 230, unlike the structure shown in FIG. 1.

Figure 2D:
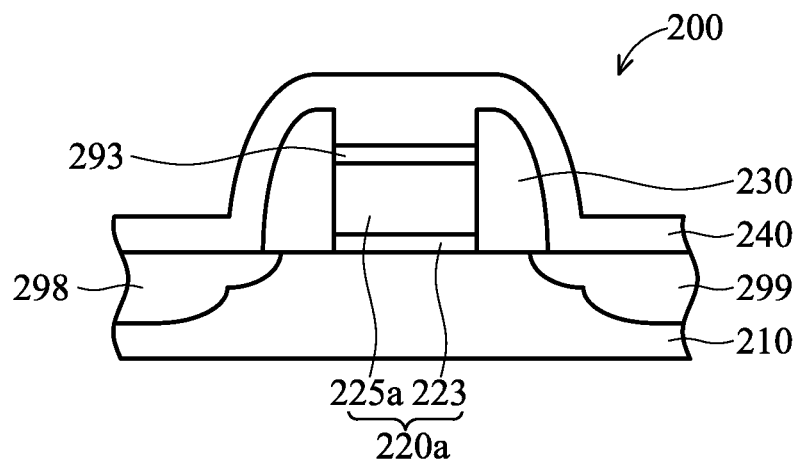

With reference to FIGS. 2D and 5, a protection layer 240 is deposited over the gate electrode 225a, the spacer 230, and the substrate 210 (at step S540). Specifically, the protection layer 240 is formed in the recess defined by the spacer 230 and gate electrode 225a. In one or more embodiments, the protection layer 240 may be an etch stop layer (ESL) formed of, for instance, silicon nitride, silicon oxynitride, silicon oxide, and/or other suitable materials having a suitably high silicon content. In one example, the protection layer 240 is an etch stop layer comprising silicon nitride. The protection layer 240 is deposited by any suitable process, including a chemical vapor deposition process, to have a sufficient thickness to protect the gate electrode 225a from a misaligned contact hole. In one example, the protection layer 240 has a thickness of about 200 Å. In one or more embodiments, the protection layer 240 is deposited to be thicker over the gate electrode 225a than over the source/drain regions 298, 299.

Figure 2E:
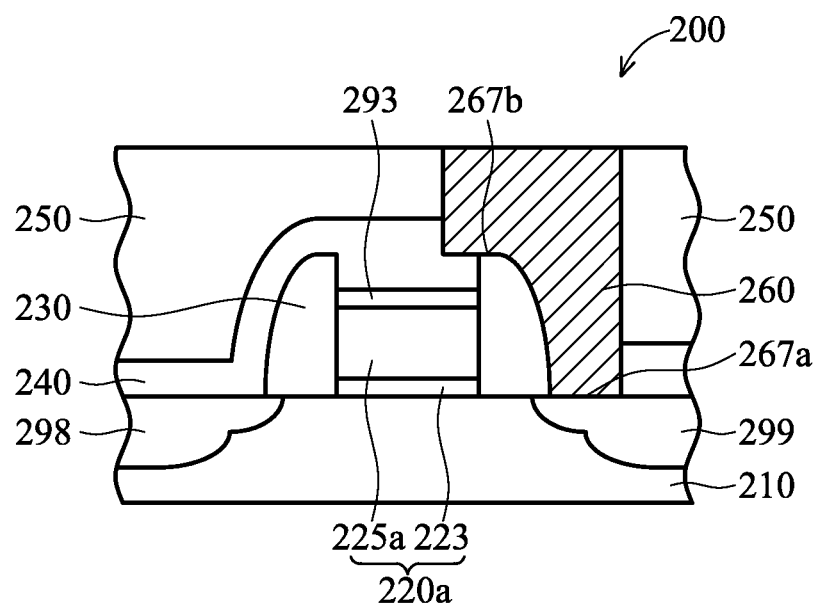

Following step S540, further steps of fabricating a semiconductor device, including ILD deposition, formation of contact holes and formation of interconnect lines, are performed. As an example, referring to FIG. 2E, a dielectric layer 250 (e.g., ILD) is deposited over the structure of FIG. 2D, and is subsequently planarized (optionally) by a chemical-mechanical-polishing process (CMP). A contact hole 260 for each of source/drain regions is subsequently formed, by a photolithography process followed by an etching process, through the dielectric layer 250 to reach the respective source/drain region. As illustrated in FIG. 2E, the contact hole 260 for source/drain region 299 is a defective hole formed by misalignment that occurs during the photolithography process.

It is noted with reference to FIG. 2E that even when misalignment occurs in the formation of source/drain contact hole 260, the gate electrode 225a is still protected by the elevated part of the spacer 230 and/or by the protection layer 240 formed in the "gate cave" between the spacers 230 and above the gate 225a, in accordance with one or more embodiments. Specifically, due to the misalignment of the contact hole 260, as the dielectric layer 250 is etched to form the contact hole 260, the protection layer 240 will also be etched. If the etching process is performed for a sufficient period, the spacer 230 may be etched as well. However, the etching through the protection layer 240 and/or spacer 230 is much slower than though the dielectric layer 250. As a result, the contact hole 260 will have a step-wise bottom as shown at 267a and 267b in FIG. 2E. When the etching is stopped (i.e., when the respective source/drain region 299 is exposed at the lower bottom portion 267a of the contact hole 260), the upper bottom portion 267b of the contact hole 260 is still spaced upwardly from the gate 225a by a thickness of the protection layer 240 and/or spacer 230, thereby preventing short circuit between the gate 225a and a conductive material (e.g., metal) subsequently filed in the contact hole 260. The above etching effect can be achieved by appropriately selecting and/or varying etch recipes, and/or by appropriately selecting the etch selectivity and/or thickness of the spacer 230 and/or the protection layer 240 and/or the dielectric layer 250.

In one or more embodiments disclosed above, short circuit problems can be prevented even when a misalignment occurs, thereby increasing the overall yield of semiconductor devices produced. Further, semiconductor devices manufactured according one or more of the disclosed embodiments have higher reliability because formation of defective cells is significantly reduced.

FIGS. 3A-3D are schematic views of a semiconductor device being fabricated according to another embodiment. It is noted that similar features in FIGS. 2A-2E and 3A-3D are similarly numbered for the sake of simplicity.

Figure 3A:
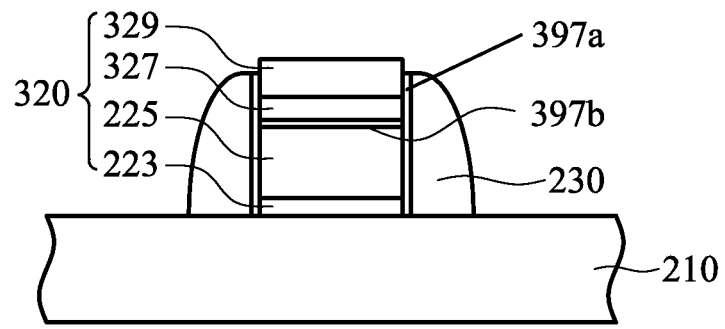
FIGS. 3A-3D are schematic cross-sectional views of a semiconductor device manufactured in a fabrication process according to another embodiment.

Referring to FIG. 3A, a gate stack 320 is formed on a substrate 210, and a spacer 230 is formed on the sidewalls of the gate stack 320. In one or more embodiments, the gate stack 320 includes a gate dielectric 223, a gate electrode 225, optionally a dummy gate 327, and optionally a hard mask 329.

In the specifically illustrated embodiment, the gate stack 320 includes the dummy gate 327 and the hard mask 329. The dummy gate 327, if included in the gate stack 320, may be formed of, for instance, silicon, polysilicon, amorphous silicon, and other material that has a desired etch rate that is distinguished from those of the gate electrode 225 and the spacer 230. The dummy gate 327 may be formed by any suitable methods, for instance, deposition (such as CVD and ALD), photolithography patterning, etch processes (such as dry etch and wet etch), and/or combinations thereof. The hard mask 329, if included in the gate stack 320, is formed of, for example, silicon nitride, silicon oxynitride, silicon carbide or other suitable materials. Further, the hard mask 329 may be formed by a deposition process or any suitable methods. After depositing layers for the gate dielectric 223, the gate electrode 225, and the dummy gate 327 and/or the hard mask 329, a gate patterning process is performed, for instance, by using the hard mask layer as an etch mask to obtain, by etching, the intended pattern of the gate stack 320 as shown in FIG. 3A.

In one or more embodiments, the spacer 230 is formed in contact with or adjacent to sidewalls of the gate stack 320 after the gate stack 320 is patterned. As explained earlier, the spacer 230 may be formed to include multiple layers of spacers/liners. Further, source/drain regions (not shown) may be formed in the substrate 210 by using the gate stack 320 and the spacer 230 as a mask. In addition, lightly doped source/drain (LDD) regions (not shown) may be formed in the substrate 210 prior to the formation of the spacer 230. The spacers 230 can be rebuilt as disclosed herein to partially cover the already formed source/drain regions.

A liner layer 397a (only shown in FIG. 3A and omitted in other figures for the sake of simplicity) may be formed prior to the formation of the spacer 230 between the gate stack 320 and the spacer 230 to prevent exposure of the gate stack 320 and protect the gate stack 320 from damage or loss during subsequent processes. A similar liner 397b (only shown in FIG. 3A and omitted in other figures for the sake of simplicity) can also be formed between the gate 225 and the dummy gate 327, and/or between the hard mask 329 and the dummy gate 327, and/or between the gate 225 and the hard mask 329 if the dummy gate 327 is omitted, to ease the process control. Such liner layers may be formed of, for instance, silicon oxide, oxynitride, silicon nitride, silicon boron nitride, or boron nitride. The thickness of each liner layer ranges, for instance, from about 15 Å to about 100 Å.

In some embodiments, one or more of the liners 397a, 397b and the dummy gate 327 is/are omitted.

Figure 3B:
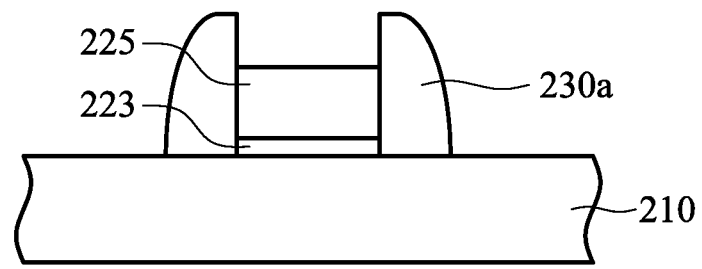

Referring to FIG. 3B, a removal step is performed to remove the hard mask 329 and the dummy gate 327 from the gate stack 320 such that the top surface of the gate electrode 225 is exposed at a level lower than the top surface of the spacer 230 by a predetermined distance. In one or more embodiments, the distance is predetermined by selecting the thicknesses of the dummy gate 327 and the hard mask to be removed. The distance between the top surface of the gate electrode 225 and that of the spacer 230 may be determined appropriately to prevent short-circuiting between the gate electrode 225 and a source/drain contact to be formed. In one or more embodiments, the distance is at least 200 Å and may be, for instance, in the range of about 200 Å to about 450 Å.

In the removal step, the hard mask 329 and the dummy gate 327 may be removed, for example, by a wet etch process, a dry etch process, other removing processes, and/or combinations thereof. In one or more embodiments, the hard mask 329 and the dummy gate 327 may be removed by separate, multiple etch processes. For instance, a dry etch process is performed to remove the hard mask 329, and subsequently, a wet etch process using suitable etchant solutions may be performed to remove the dummy gate 327. In another example, an etch back process is performed to remove the hard mask 329 and, together with the hard mask 329, an upper portion of the spacer 230 co-elevational with the hard mask 329. The remaining, lower portion of the spacer 230 is denoted as 230a in FIG. 3B. The etch back process stops when the dummy gate 327 is exposed. The exposed dummy gate 327 is subsequently etched away as described above.

In one or more embodiments, after the removal of the hard mask 329 and the dummy gate 327, a silicidation (i.e., self-aligned silicidation) process or any suitable method may be performed to provide the top surfaces of the gate electrode 225 and source/drain regions (not shown) with silicided regions as contact features as described above. It should be noted that, again, the silicided region (not shown) on top of the gate electrode 225 is confined within the boundary defined by spacer 230a, and is prevented from extruding to the top of spacer 230a, unlike the structure shown in FIG. 1.

Figure 3C:
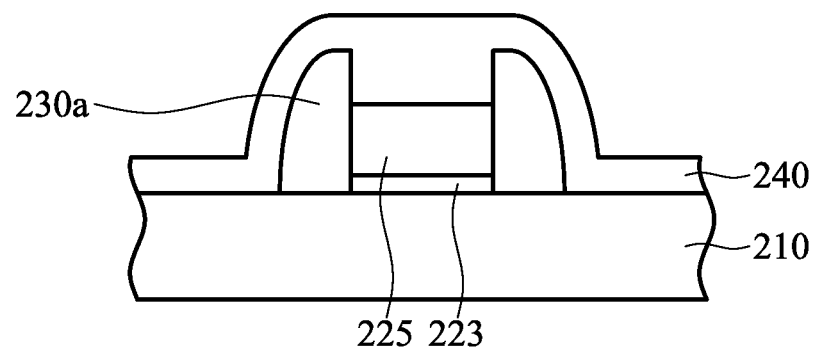
Figure 3D:
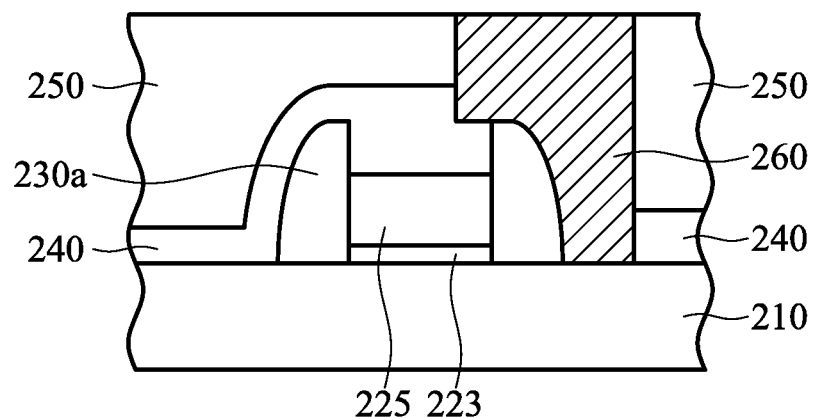

Referring to FIG. 3C, a protection layer 240 is deposited over the gate electrode 225, the spacer 230a, and the substrate 210 as described above. In one or more embodiments, the protection layer 240 may be an etch stop layer (ESL) formed of, for instance, silicon nitride, silicon oxynitride, and/or other suitable materials. Subsequently, referring to FIG. 3D, a dielectric layer 250 is deposited, and a contact hole 260 for source/drain regions is subsequently formed. Although the contact hole 260 for source/drain regions might be a defective hole, as illustrated in FIG. 3D, due to misalignment, a short circuit problem can be prevented by the elevated spacer 230a and/or the protection layer 240 as disclosed herein. In one or more embodiments, the protection layer 240 is deposited to be thicker over the gate electrode 225 than over the source/drain regions, as described with respect to the source/drain regions 298, 299 in FIG. 2D, to further ensure that short circuits can be prevented.

FIGS. 4A-4E are schematic views of a semiconductor device being fabricated according to yet another embodiment. This embodiment is described also with reference to FIG. 6.

Figure 4A:
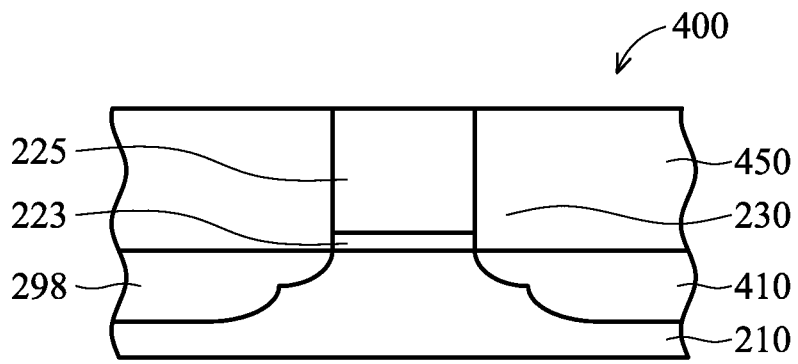
FIGS. 4A-4E are schematic cross-sectional views of a semiconductor device manufactured in a fabrication process according to yet another embodiment.
Figure 6:
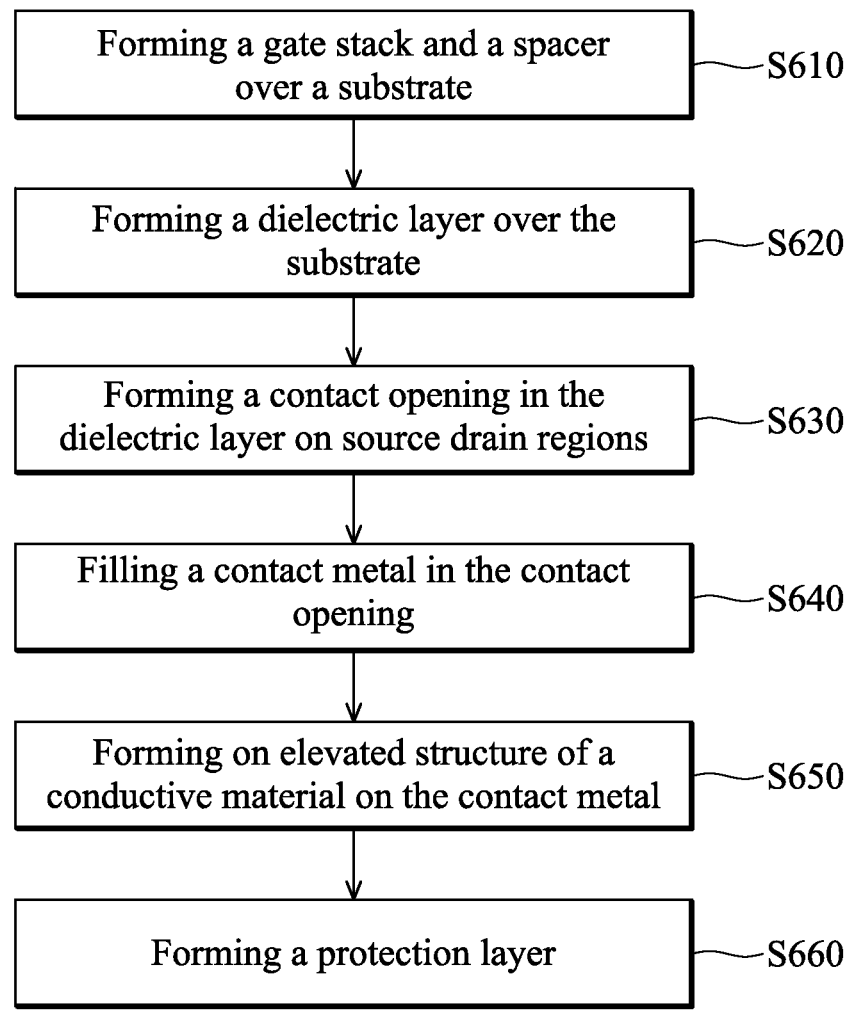
FIG. 6 is a flow chart of the steps performed in the fabrication process shown in FIG. 4A-4E.

Referring to FIGS. 4A and 6, the semiconductor device 400 is formed to include a substrate 210 having thereon a gate dielectric 223, a gate electrode 225, and a spacer 230 (S610). The substrate 210 includes source/drain regions 410. Further, a first dielectric layer 450 is formed over the substrate 210. In one or more embodiments, the first dielectric layer 450 may be an interlayer dielectric (ILD) layer formed of silicon oxide, silicon nitride, silicon oxynitride, spin-on glass (SOG), fluorinated silica glass (FSG), carbon doped silicon oxide (e.g., SiCOH), polyimide, other suitable dielectric materials, and/or combinations thereof. In one or more embodiments, an ILD layer for the first dielectric layer 450 is deposited over the substrate 210, the gate electrode 225, and the spacer 230, and is subsequently planarized by a chemical-mechanical-polishing (CMP) process until the top surfaces of the gate electrode 225 and the spacer 230 overlying the substrate 210 are exposed as illustrated in FIG. 4A (S620). The resulting structure exemplarily shown in FIG. 4A is referred to in one or more embodiments as a replacement gate structure.

Figure 4B:
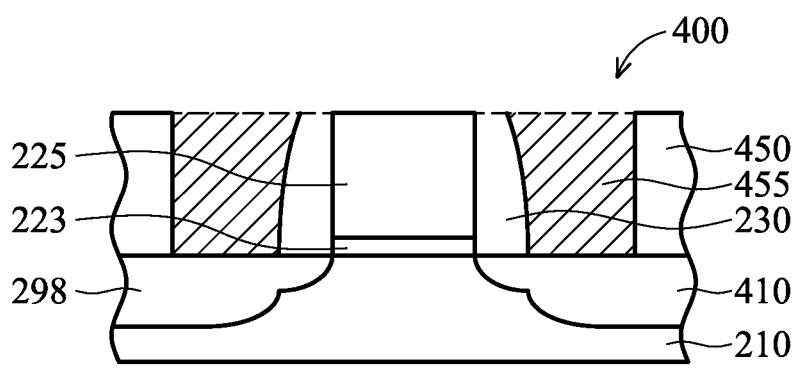

Referring to FIGS. 4B and 6, a contact opening 455 is formed in the first dielectric layer 450 over each source/drain region 410 (S630). In an example where the gate electrode 225 is a metal gate containing Al, AlTi, Ti, TiN, TaN, Ta, TaC, TaSiN, W, WN, MoN, and/or other suitable materials, and the spacer 230 is formed of silicon nitride, silicon carbide, silicon oxynitride, and/or other suitable materials, the first dielectric layer 450 may be selectively etched to form the contact opening 455 without damaging the gate electrode 225 and the spacer 230, for instance, by a dry etch process. In one or more embodiments, a plasma ion etch process is performed to form the contact opening 455, by using appropriate etching gases such as BP, $CH_2F_2$, $CH_3F$, $CF_4$, $O_2$, and He. After the opening 455 is formed, a silicidation process may be performed as described above to provide a silicided region (not shown) on the source/drain region 410.

Figure 4C:
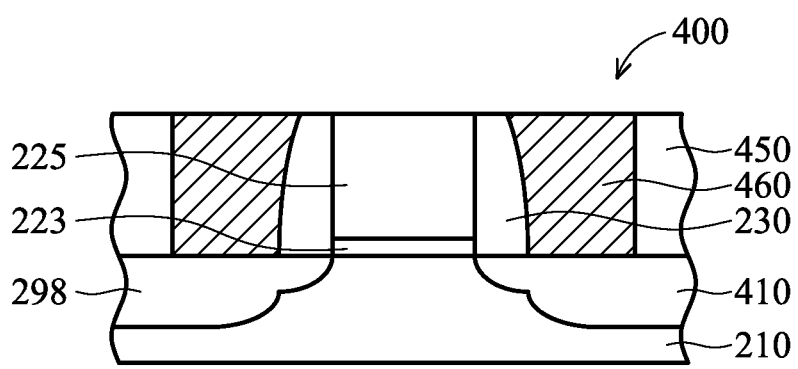

Referring to FIGS. 4C and 6, metallization in the contact opening 455 is conducted (S640). That is, a contact metal 460 selected from aluminum, copper, tungsten, any suitable conductive materials, and/or combinations thereof, is filled in the contact opening 455 by any suitable deposition process, e.g., evaporation or sputtering methods, such as a copper damascene process. The silicided region on the source/drain region 410 makes good contact with the contact metal 460. In one or more embodiments, wet or dry etching may follow to remove dislodged metal atoms on undesired surfaces, such as on the first dielectric layer 450.

Figure 4D:
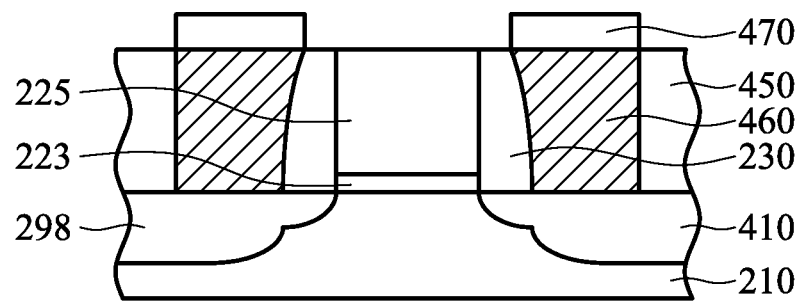

Referring to FIGS. 4D and 6, an elevated structure 470 of a conductive material is selectively formed on the contact metal 460 by any suitable method, such as a selective metal growth process (S650). The elevated structure 470 may be formed of any suitable conductive material. In one or more embodiments, the elevated structure may be formed of a metal capping material, such as cobalt tungsten phosphide (CoWP) and tungsten to a thickness of about 20 to 50 nm. For instance, a CoWP layer may be deposited on the contact metal 460 by a selective metal growth process. In one or more embodiments, a solution containing cobalt, tungsten, and phosphorus, for example, from cobalt sulfate, sodium hypophosphate, and ammonium tungstate, may be sprayed on the contact metal 460. If necessary, a seeding solution, for instance, containing Pd, may be previously applied to facilitate formation of CoWP on the metal contact 460. The elevated structure 470 may be formed to a predetermined thickness by which the top surface of the elevated structure 470 is higher than the top surface of the gate electrode 225. The thickness of the elevated structure 470 may be determined appropriately to prevent short-circuiting between the gate electrode 225 and a source/drain interconnect line to be formed. In one or more embodiments, the thickness may be, for instance, in the range of about 50-about 450 Å. For example, the elevated structure 470 is formed to have a thickness of 250 Å.

Figure 4E:
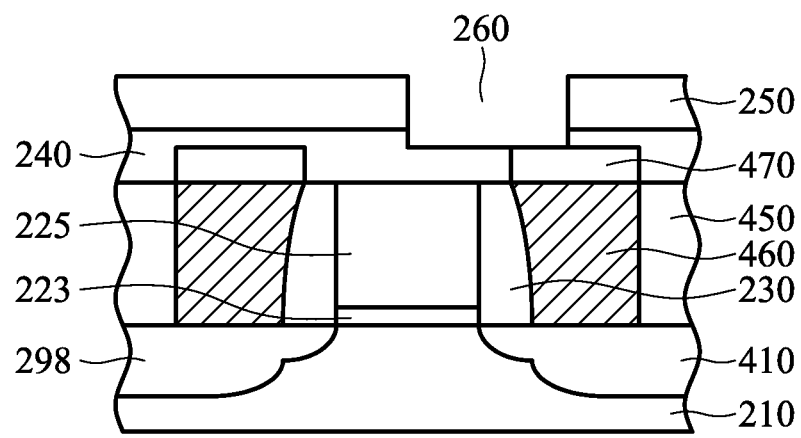

With reference to FIGS. 4E and 6, a protection layer 240 is deposited over the gate electrode 225, the spacer 230, and the elevated structure 470 (at step S660). In one or more embodiments, the protection layer 240 is deposited to be thicker over the gate electrode 225 than over the source/drain regions 410. In one or more embodiments, a second dielectric layer 250 (e.g., ILD) is further deposited over the protection layer 240, a contact hole 260 for source/drain regions is formed through the dielectric layer 250 and the protection layer 240, and a further contact material (not shown) is filled in the contact hole 260 to be in electrical contact with the source/drain regions 410 via the metal contact 460 and the conductive elevated structure 470. As illustrated in FIG. 4E, the contact hole 260 for source/drain regions 410 is a defective hole formed by misalignment.

As can be seen in FIG. 4E, the formation of contact hole 260 is stopped when the elevated structure 470 is exposed. The conductive material, e.g., a metal, subsequently filled in the contact hole 260 is prevented from forming a short circuit with the gate electrode 225 by a portion of the protection layer 240 formed on top of the gate electrode 255 and within the boundary defined by the elevated structure 470. As described above, the protection layer 240 may be an etch stop layer (ESL) formed of, for instance, silicon nitride, silicon oxynitride, and/or other suitable materials. The protection layer 240 is deposited to have a sufficient thickness to protect the gate electrode 225 from a misaligned contact hole 260. In one example, the protection layer 240 has a thickness in the range of 50-500 Å. In one or more embodiments, the protection layer 240 has a thickness of about 200 Å.

An aspect of the present disclosure pertains to a semiconductor device includes a gate stack overlying a substrate. The semiconductor device further includes a spacer on sidewalls of the gate stack, where a top surface of the spacer is above a top surface of the gate stack. Additionally, the semiconductor device includes a protection layer overlying the gate stack and filling at least a portion of a space surrounded by the spacer above the top surface of the gate stack. Furthermore, the semiconductor device includes a contact hole over the spacer, where the contact hole extends over the gate stack, and where a sidewall of the contact hole has a step-wise shape.

Still another aspect of the present disclosure pertains to a semiconductor device including a gate stack overlying an active area, where the active area includes a source region and a drain region. Additionally, the semiconductor device includes a spacer formed on sidewalls of the gate stack, where a top surface of the spacer is farther from the active area than a top surface of the gate stack. Furthermore, the semiconductor device includes a conductive material extending upward from at least one of the source region or the drain region. Moreover, the semiconductor device includes an elevated contact structure over the at least one of the source region or the drain region. Additionally, the semiconductor device includes a protection layer over the gate stack and the conductive material, where the protection layer exposes a portion of the conductive material.

In yet another aspect of the present disclosure pertains to a semiconductor device including a gate stack overlying a substrate. Additionally, the semiconductor device includes a spacer on sidewalls of the gate stack, where a top surface of the spacer is above a top surface of the gate stack. Furthermore, the semiconductor device includes a protection layer overlying the gate stack and filling at least a portion of a space surrounded by the spacer above the top surface of the gate stack. Moreover, the semiconductor device includes a contact hole over the spacer, where a sidewall of the contact hole is in physical contact with the spacer.

The foregoing has outlined features of several embodiments so that those skilled in the art may better understand the detailed description that follows. Those skilled in the art should appreciate that they may readily use the present disclosure as a basis for designing or modifying other processes and structures for carrying out one or more of the same or similar purposes and/or achieving one or more of the same or similar advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a gate stack overlying a substrate;
   a spacer on sidewalls of the gate stack, wherein a top surface of the spacer is above a top surface of the gate stack;
   a continuous protection layer overlying the gate stack and completely filling a space surrounded by the spacer above the top surface of the gate stack, wherein the continuous protection layer is in direct contact with the substrate; and
   a contact hole over the spacer, wherein the contact hole extends over the gate stack, and wherein a sidewall of the contact hole has a step-wise shape,
   wherein an outer surface of the spacer forms an interface with the contact hole.

2. The semiconductor device according to claim 1, wherein a distance between the top surface of the spacer and the top surface of the gate stack is at least 200 Angstroms (Å).

3. The semiconductor device according to claim 1, wherein the continuous protection layer comprises at least one selected from silicon nitride, silicon oxynitride, or silicon oxide.

4. The semiconductor device according to claim 1, further comprising a dielectric layer overlying the continuous protection layer.

5. The semiconductor device according to claim 1, further comprising a liner layer between the gate stack and the spacer.

6. The semiconductor device according to claim 5, wherein the liner layer has a thickness ranging from 15 Å to 100 Å.

7. A semiconductor device, comprising:
   a gate stack overlying an active area, wherein the active area comprises a source region and a drain region;
   a spacer on sidewalls of the gate stack;
   a conductive material extending upward from at least one of the source region or the drain region;
   an elevated contact structure over the at least one of the source region or the drain region, wherein the elevated contact structure extends over at least a portion of the spacer; and
   a protection layer over the gate stack and the conductive material, wherein the protection layer exposes a portion of the conductive material, the protective layer extends along the gate stack and separates the elevated contact structure from the gate stack, and a thickness of the protection layer over the source region or the drain region is less than a thickness of the protection layer over the gate stack.

8. The semiconductor device according to claim 7, wherein the elevated contact structure comprises cobalt tungsten phosphide.

9. The semiconductor device according to claim 7, wherein the elevated contact structure has a thickness ranging from 20 nanometers (nm) to 50 nm.

10. The semiconductor device according to claim 7, wherein the conductive material comprises at least one of aluminum, copper, or tungsten.

11. The semiconductor device according to claim 7, wherein the gate stack comprising a gate dielectric between a gate electrode and the active area.

12. The semiconductor device according to claim 11, wherein the gate electrode comprises Al, AlTi, Ti, TiN, TaN, Ta, TaC, TaSiN, W, WN, or MoN.

13. The semiconductor device according to claim 7, wherein the spacer comprises silicon nitride, silicon carbide, or silicon oxynitride.

14. The semiconductor device according to claim 7, wherein at least one of the source region or the drain region comprises a silicided region.

15. A semiconductor device, comprising:
    a gate stack overlying a substrate;
    a spacer on sidewalls of the gate stack, wherein a top surface of the spacer is above a top surface of the gate stack;
    a continuous protection layer overlying the gate stack and filling an entirety of a space surrounded by the spacer above the top surface of the gate stack, wherein the continuous protection layer is in direct contact with the substrate; and
    a contact hole over the spacer,
    wherein an outer surface of the spacer forms an interface with the contact hole.

16. The semiconductor device according to claim 15, wherein the substrate comprises lightly doped source and drain regions.

17. The semiconductor device according to claim 16, wherein at least one of the lightly doped source region or the lightly doped drain region comprises a silicided region.

18. The semiconductor device according to claim 15, wherein the spacer comprises silicon nitride, silicon carbide, or silicon oxynitride.

19. The semiconductor device according to claim 15, wherein the gate stack comprising a gate dielectric between a gate electrode and the substrate.

20. The semiconductor device according to claim 19, wherein the gate electrode comprises Al, AlTi, Ti, TiN, TaN, Ta, TaC, TaSiN, W, WN, or MoN.

* * * * *